United States Patent [19]
Ando

[11] Patent Number: 5,621,228
[45] Date of Patent: Apr. 15, 1997

[54] HETEROJUNCTION FIELD EFFECT TRANSISTOR WITH NON-ALLOY OHMIC CONTACT ELECTRODES

[75] Inventor: Yuji Ando, Tokyo, Japan

[73] Assignee: NEC Corporation, Tokyo, Japan

[21] Appl. No.: 515,530

[22] Filed: Aug. 15, 1995

[30] Foreign Application Priority Data

Aug. 16, 1994 [JP] Japan ................................. 6-192356

[51] Int. Cl.$^6$ ..................... H01L 31/0328; H01L 31/0336
[52] U.S. Cl. ............................................. 257/192; 257/194
[58] Field of Search ................................ 257/192, 194, 257/280, 282, 283

[56] References Cited

PUBLICATIONS

Tatsushi Akazaki et al., "Improved InAlAs/InGaAs HEMT Characteristics by Inserting an InAs Layer into the InGaAs Channel", *IEEE Electron Device Letters*, vol. 13, No. 6, Jun. 1992.

*Primary Examiner*—Wael Fahmy
*Attorney, Agent, or Firm*—Young & Thompson

[57] ABSTRACT

An InAlAs/InGaAs type heterojunction FET is provided which can reduce the source and drain contact resistance through the InAlAs layer without lowering the sheet carrier concentration so as to form an ohmic contact without alloying. A laminated structure of an undoped InAlAs buffer layer, an undoped InGaAs channel layer which accumulates two-dimensional electron gas, InAlAs electron supply layers containing an n-type layer, an undoped InAlAs Schottky layer, a first cap layer of n-type InAlAs, a second cap layer, and a third cap layer of n-type InGaAs are sequentially formed on a semi-insulating InP substrate. When undoped InGaAs or n-type IN(AlGa)As is employed as the second cap layer, the potential barrier at the interfaces between the cap layers are reduced so that the contact resistivity between the cap layer and the channel layer can be reduced to as low as $10^{-7}$ $\Omega cm^2$.

7 Claims, 4 Drawing Sheets

C.B. : CONDUCTION BAND
E_F : FERMI LEVEL

HETEROJUNCTION FIELD EFFECT TRANSISTOR WITH NON-ALLOY OHMIC CONTACT ELECTRODES

BACKGROUND OF THE INVENTION

1. Field of the Invention

The present invention relates to a heterojunction field effect transistor (FET) applied to a millimeter wave or microwave transmitter-receiver system and a high speed digital circuit.

2. Description of the Related Art

FIG. 9 shows the structure of a conventional heterojunction FET. Such heterojunction FET was reported, for example, in "IEEE Electron Device Lett.," Vol. EDL-13, p. 325, 1992, by T. Akazaki.

In the figure, the heterojunction FET consists of a semi-insulating (hereinafter called "SI") InP substrate 10, an undoped InAlAs layer 91 constituting a buffer layer, an undoped InGaAs layer 92 constituting a channel layer, an undoped InAlAs layer 93 constituting a spacer layer, a Si planar-doped layer 94, an n-type InAlAs layer 95 constituting an electron supply layer, an undoped InAlAs layer 96 constituting a Schottky layer, and cap layers 97 and 99 which are constituted by an n-type InAlAs layer and an n-type InGaAs layer, respectively, a source electrode 11S and a drain electrode 11D formed by vacuum deposition on the n-type InGaAs cap layer 99 to make ohmic contact with the channel layer 92. In a region between the source electrode 11S and the drain electrode 11D, a gate electrode 12 is formed by vacuum deposition on the surface of the Schottky layer 96 which is exposed by etching out parts of the epitaxial layers.

FIG. 10 shows a conduction band profile between the n-type InGaAs cap layer 99 and the undoped InAlAs buffer layer 91 of such heterojunction FET. Because such a heterojunction FET has the n-type InAlAs layer 97 between the undoped InAlAs Schottky layer 96 and the n-type InGaAs cap layer 99, the potential barrier caused by discontinuity of the conduction band at the interface between the InAlAs Schottky layer 96 and the InAlAs cap layer 97 becomes parabolic. Thus, when compared with a case where the n-InGaAs layer 99 is formed in direct contact with the undoped InAlAs layer 96, the effective thickness of the potential barrier is reduced, and the tunnel current is caused to easily flow through the InAlAs layer forming effectively an ohmic contact without alloying, i.e., by forming a non-alloy ohmic contact.

As discussed above, the heterojunction FET of the prior art can form non-alloy ohmic contacts by providing a cap layer having a dual-layered structure of n-InGaAs/n-InAlAs. However, because it has conduction band discontinuity as high as about 0.5 eV at the InAlAs/InGaAs hetero-interface, a high potential barrier is formed at the interface between the InAlAs layer 97 and the InGaAs layer 99 so that the contact resistivity ($\rho_c$) between the cap layer and the channel layer cannot be sufficiently lowered.

Generally, contact resistance ($R_c$) of a heterojunction FET having a cap layer with low resistance is expressed by using sheet resistance ($r_s$) and $\rho_c$, as follows:

$$R_c = (r_s \rho_c)^{0.5} \cot h(d/L_T) \quad (1)$$

Here, d is the length of electrode, and $L_T = (\rho_c/r_s)^{0.5}$ is the transfer length. Generally, because d is sufficiently larger than $L_T$, equation (1) reduces to $R_c \approx (r_s \rho_c)^{0.5}$. Thus, an increase of $\rho_c$ in the ohmic electrode leads to increase of $R_c$ which increases the source resistance and the drain resistance to degrade power gain and noise factor.

It is known in the art that, as the impurity concentration in a semiconductor becomes high, adjacent impurity atoms start to affect each other so that discrete impurity levels converge to form degenerate impurity bands having a band-like nature. In the n-type InGaAs, carrier degeneration starts at the impurity concentration of $5 \times 10^{17}$ cm$^{-3}$ or more to form an impurity band. Thus, in a conventional heterojunction FET in which the n-InGaAs cap layer 99 is provided in contact with the n-InAlAs cap layer 97, even though an electron accumulation layer is formed near the hetero-interface of the two n-type cap layers, the Fermi level is pinned by an impurity band with high density of states in the n-type InGaAs layer 99 making band bending at the interface small so that the potential barrier in the n-type InAlAs layer 97 cannot be lowered sufficiently.

OBJECT OF THE INVENTION

The object of the present invention is to lower $\rho_c$ and to reduce parasitic resistance of the InAlAs/InGaAs type heterojunction FET device without reducing carrier concentration, or without degrading $r_s$ by means of lowering the potential barrier at the cap layer/Schottky layer interface.

SUMMARY OF THE INVENTION

According to the present invention, there is provided a heterojunction FET comprising a multi-layered hetero-structure in which an undoped InAlAs buffer layer, an undoped InGaAs channel layer accumulating two-dimensional electron gas (2DEG), an InAlAs electron supply layer containing at least one n-type layer, an undoped InAlAs Schottky layer, and a cap layer are sequentially formed on a semi-insulating InP substrate. A source electrode and a drain electrode is in contact with the cap layer, and a gate electrode between the source and drain electrodes is in contact with the undoped InAlAs Schottky layer. The cap layer is of a laminated structure of a first cap layer consisting of InAlAs containing at least one n-type layer, a second cap layer consisting of undoped InGaAs and a third cap layer consisting of n-type InGaAs, and the second cap layer has film thickness of 3 nm or more but 10 nm or less.

The invention also provides, a heterojunction FET which comprises a multi-layered hetero-structure as described in the previous paragraph above but with the cap layer having a laminated structure of a first cap layer consisting of InAlAs containing at least one n-type layer, a second cap layer consisting of n-type In(Al$_y$Ga$_{1-y}$)As (0<y<1), and a third cap layer consisting of n-type InGaAs.

Furthermore, the invention also provides a heterojunction FET which comprises a multi-layered hetero-structure as described above, but with the cap layer having a laminated structure of a first cap layer consisting of InAlAs containing at least one n-type layer, a second cap layer consisting of n-type In(Al$_y$Ga$_{1-y}$)As, and a third cap layer consisting of n-type InGaAs, the composition ratio y of Al in the second cap layer changing from the first cap layer side to the third cap layer side with a gradual or stepwise decrease from 1 to 0.

To lower the potential barrier in the n-type InAlAs layer 97, in the present invention, an undoped InGaAs spacer layer (second cap layer) is inserted in the interface between the n-type InAlAs layer 97 (first cap layer) and the n-type InGaAs layer 99 (third cap layer). While an accumulated electron layer is formed within the undoped InGaAs spacer layer, as no impurity band is formed in this spacer layer, the Fermi level rises freely and the band is bent down. This promotes effective lowering of the potential barrier so that the tunnel current may freely flow through the InAlAs cap layer. The undoped InGaAs spacer layer is formed to have a thickness required to be effective as an electron accumulation layer, which is 3–10 nm, and desirably 5 nm or more, but 8 nm or less.

In addition, in another embodiment of the present invention, an n-type In($Al_yGa_{1-y}$)As layer (0<y<1) of an intermediate composition (second cap layer) is inserted at the interface between the n-type InAlAs layer 97 (first cap layer) and the n-type InGaAs cap layer 99 (third cap layer). The composition ratio y of Al is desirably more than 0.4 but less than 0.6. Since In(AlGa)As has an electron affinity higher than InAlAs, and lower than InGaAs, the conduction band spike formed at the hetero-interface of the two cap layers is lowered thereby decreasing the potential barrier and allowing the tunnel current to flow freely.

Furthermore, it is another embodiment of this invention to have the second cap layer composed of an n-type In($Al_yGa_{1-y}$)As compositional graded layer, wherein the composition ratio y of Al is changed from the first cap layer side to the third cap layer side, with a gradual or stepwise decrease from 1 to 0. When the compositional graded layer is decreased in a stepwise manner, the second cap layer may be composed of a plurality of n-type In($Al_yGa_{1-y}$)As layers of different Al composition y. In this case, no conduction band spike exists between the InAlAs layer and the InGaAs layer, thereby further decreasing the potential barrier so that the tunnel current can be made to flow easier.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS (First Embodiment)

Figure 1:
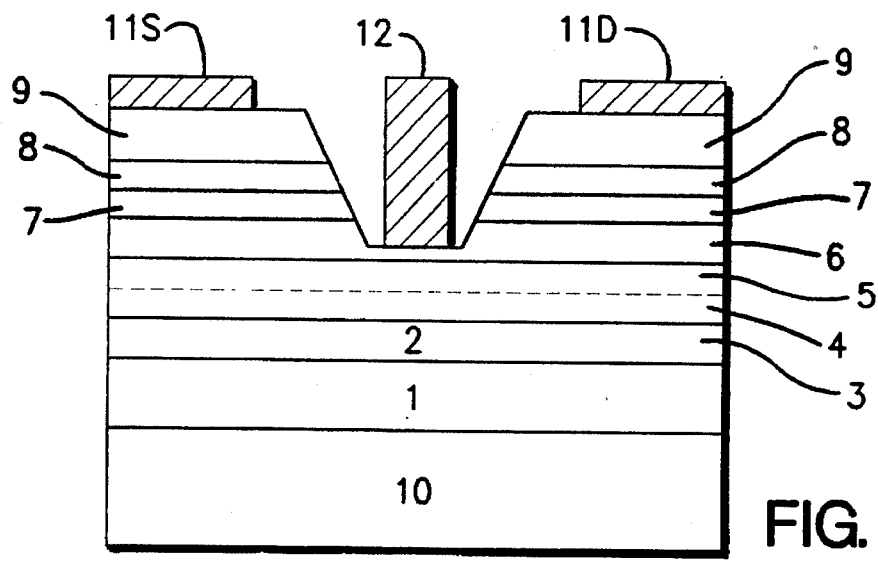
FIG. 1 is a cross section showing the structure of the heterojunction FET according to the first embodiment of the present invention.

FIG. 1 shows a cross sectional view of the structure of the heterojunction FET according to the first embodiment of the present invention. In the figure, there are shown an SI-InP substrate 10, an undoped InAlAs layer 1 constituting a buffer layer, an undoped InGaAs layer 2 constituting a 2DEG channel layer, an undoped InAlAs layer 3 constituting a spacer layer, an Si planar doped layer 4 (dotted line), an n-type InAlAs layer 5 constituting an electron supply layer, an undoped InAlAs layer 6 constituting a Schottky layer, and cap layers 7, 8, and 9 each of which consists of an n-type InAlAs layer (first cap layer), an undoped InGaAs layer (second cap layer), and an n-type InGaAs layer (third cap layer), respectively. There are also a source electrode 11S, a drain electrode 11D, and a gate electrode 12. One of the novel features of this embodiment lies in that the undoped InGaAs layer 8 is inserted in the interface between the n-type InAlAs cap layer 7 and the n-type InGaAs cap layer 9.

Such heterojunction FET is produced as follows. Sequentially formed on (100) SI-InP substrate 10 by, for example, molecular beam epitaxy (hereinafter abbreviated "MBE") are:

Undoped InAlAs layer 1 . . . 200 nm,
Undoped InGaAs layer 2 . . . 40 nm,
Undoped InAlAs layer 3 . . . 3 nm,
Si planar doped layer 4
(sheet concentration $5 \times 10^{12}/cm^2$)
n-type InAlAs layer 5
(impurity concentration $2 \times 10^{18}/cm^3$) . . . 15 nm,
Undoped InAlAs layer 6 . . . 20 nm,
n-type InAlAs layer 7
(impurity concentration $5 \times 10^{18}/cm^3$) . . . 20 nm,
Undoped InGaAs layer 8 . . . 5 nm, and
n-type InGaAs layer 9
(impurity concentration $5 \times 10^{18}/cm^3$) . . . 20 nm.

Then, the source electrode 11S and the drain electrode 11D are formed on the n-type InGaAs layer 9 by evaporating and depositing composite metals such as AuGe/Ni/Au. In addition, the gate electrode 12 is formed in a region between the source electrode 11S and the drain electrode 11D by etching off part of n-type InAlAs layer 7, undoped InGaAs layer 8, and n-type InGaAs layer 9 using a patterned resist mask which is formed, for example, by electron beam (EB) exposure to thereby expose the surface of the undoped InAlAs layer 6. Then, such composite metals as Ti/Pt/Au are evaporated. Thus, the heterojunction FET as shown in FIG. 1 is fabricated.

Figure 2:
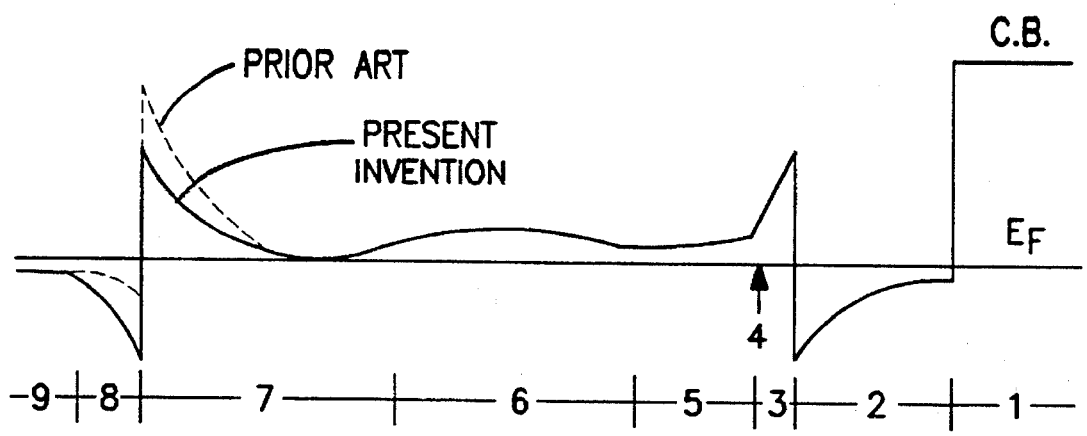
FIG. 2 is a potential band diagram showing the conduction band minimum of the heterojunction FET according to the first embodiment of the present invention.
Figure 10:
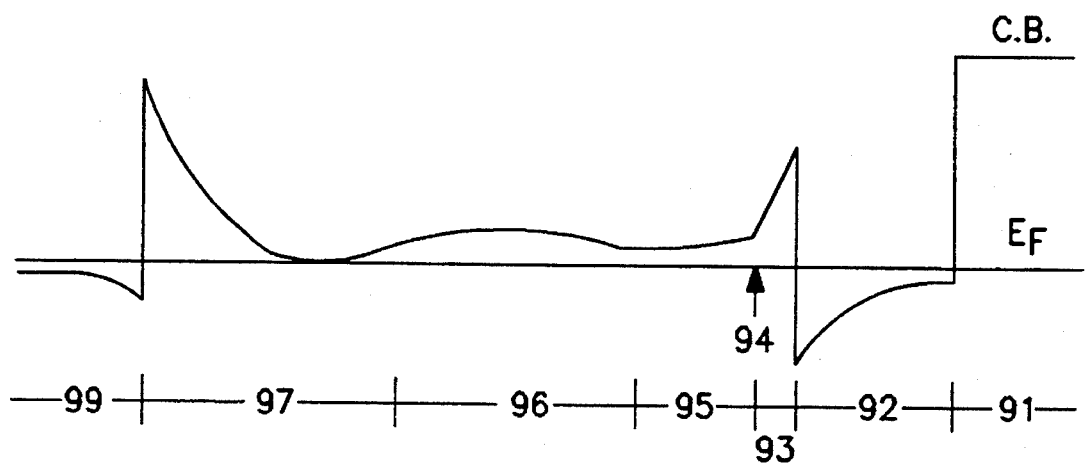
FIG. 10 is a potential band diagram showing the conduction band minimum of the heterojunction FET according to the prior art.

FIG. 2 shows a conduction band minimum profile between the n-type InGaAs cap layer 9 and the undoped InAlAs buffer layer 1 of the present embodiment (solid line) and the prior art (dotted line). As described earlier, in the present embodiment, an electron accumulation layer is formed in the undoped InGaAs layer 8 (second cap layer). Because no impurity band is formed in this layer, the Fermi level rises to bend the band thereby effectively lowering the potential barrier in the first cap layer 7. Thus, the tunnel current can more easily flow through the InAlAs layer than in the prior art heterojunction FET without a second cap layer (dotted line).

Figure 3:
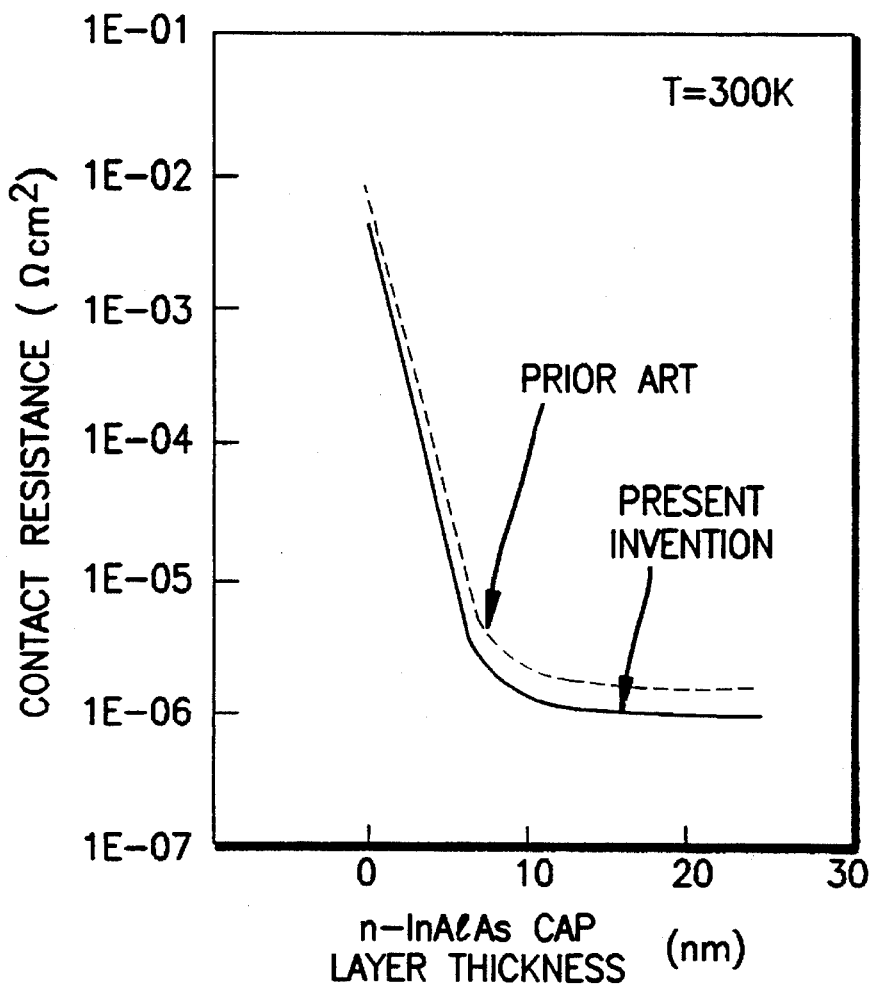
FIG. 3 shows dependence of contact resistivity on n-InAlAs cap layer thickness in the heterojunction FET according to the first embodiment of the present invention.

FIG. 3 shows the variation of non-alloy contact resistivity ($\rho_c$) at room temperature when the film thickness of first cap layer 7 (n-InAlAs) in the embodiment is changed (solid line). The dotted line indicates the result obtained when the film thickness of n-InAlAs layer 97 is changed in the prior art device without the second cap layer. As the film thickness of the n-InAlAs layer ($t_n$) increases, $\rho_n$ decreases and levels off to a constant value when $t_n$ is 10 nm or more. While the minimum value of $\rho_c$ is $1.4 \times 10^{-6}$ $\Omega cm^2$ in the prior art, it is $9.0 \times 10^{-7}$ $\Omega cm^2$ in the present invention, which shows a decrease of about 35%. Meanwhile, the sheet carrier concentration in the undoped InGaAs 2DEG channel layer is maintained at a substantially constant value ($\sim 3.6 \times 10^{12}$/cm$^2$) for variation of $t_n$ in either structures, so that the sheet resistance ($r_s$) is substantially the same in both structures. Thus, the present embodiment can reduce $\rho_c$ of the non-alloy ohmic contact without increasing $r_3$, and can thus reduce the parasitic resistance of the heterojunction FET device. In addition, as the gate electrode is formed on the undoped InAlAs layer 6, high gate withstand voltage can be assured.

(Second Embodiment)

Figure 4:
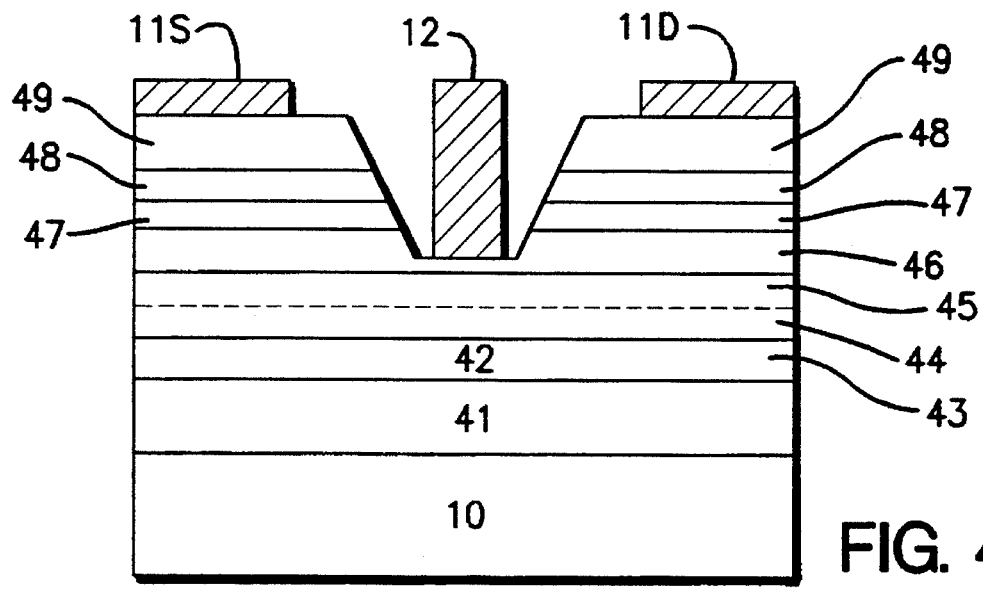
FIG. 4 is a cross section showing the structure of the heterojunction FET according to the second embodiment of the present invention.

FIG. 4 is a cross section showing the structure of the heterojunction FET according to the second embodiment of the present invention. In the figure, there are shown a Si-InP substrate 10, an undoped InAlAs layer 41 constituting a buffer layer, an undoped InGaAs layer 42 constituting a 2DEG channel layer, an undoped InAlAs layer 43 constituting a spacer layer, an Si planar doped layer 44, an n-type InAlAs layer 45 constituting an electron supply layer, an undoped InAlAs layer 46 constituting a Schottky layer, and cap layers 47, 48, and 49 each of which consists of an n-type InAlAs layer (first cap layer), an undoped In(AlGa)As layer (second cap layer), and an n-type InGaAs layer (third cap layer). There are also a source electrode 11S, a drain electrode 11D, and a gate electrode 12. One of the novel features of this embodiment lies in that an n-type In(AlGa)As intermediate composition layer 48 is inserted at the interface between the n-type InAlAs cap layer 47 and the n-type InGaAs cap layer 49.

Such heterojunction FET is produced as follows. Sequentially formed on (100) SI-InP substrate 10 by, for example, MBE are:

Undoped InAlAs layer 41 . . . 200 nm,
Undoped InGaAs layer 42 . . . 40 nm,
Undoped InAlAs layer 43 . . . 3 nm,
Si planar doped layer 44
(sheet concentration $5 \times 10^{12}$/cm$^3$)
n-type InAlAs layer 45
(impurity concentration $2 \times 10^{18}$/cm$^3$) . . . 15 nm,
Undoped InAlAs layer 46 . . . 20 nm,
n-type InAlAs layer 47
(impurity concentration $5 \times 10^{18}$/cm$^3$) . . . 20 nm,
n-type In$_{0.5}$Ga$_{0.5}$As layer 48
(impurity concentration $5 \times 10^{18}$/cm$^3$) . . . 5 nm, and
n-type InGaAs layer 49
(impurity concentration $5 \times 10^{18}$/cm$^3$) . . . 20 nm.

Then, the source and drain electrodes 11S, 11D as well as the gate electrode 12 are formed in much the same way as in the case of the first embodiment. The heterojunction FET as shown in FIG. 4 is thus fabricated.

Figure 5:
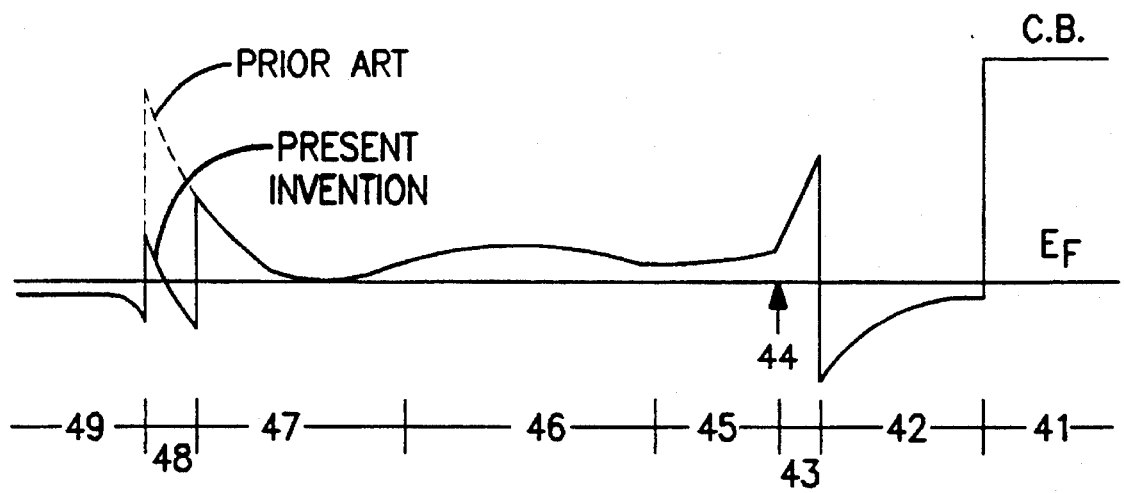
FIG. 5 is a potential band diagram showing the conduction band minimum of the heterojunction FET according to the second embodiment of the present invention.

FIG. 5 shows the conduction band minimum profile between the n-type InGaAs cap layer 49 and the undoped InAlAs buffer layer 41 of the second embodiment (solid line) and the prior art. As described earlier, because the n-In(AlGa)As layer (second cap layer) has an electron affinity higher than the n-InAlAs layer (first cap layer), and lower than the n-InGaAs layer (third layer), the conduction band spike formed at the hetero-interface of the second and third cap layers becomes lower than in the prior art heterojunction FET which has no second cap layer. Thus, tunnel current can easily flow therethrough.

Figure 6:
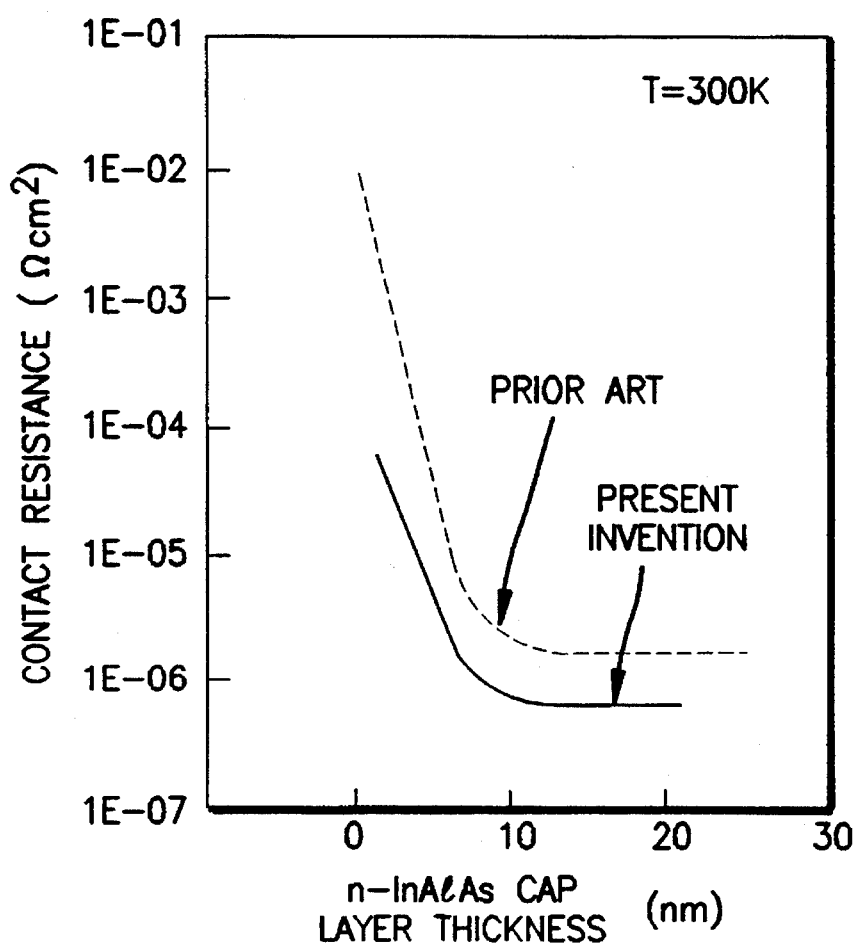
FIG. 6 shows dependence of contact resistivity on n-InAlAs cap layer thickness in the heterojunction FET according to the second embodiment of the present invention.

FIG. 6 shows the variation of non-alloy contact resistivity ($\rho_c$) at room temperature obtained when the film thickness of the n-InAlAs layer ($t_n$) is changed. The solid line indicates the result for the present embodiment, while the dotted line indicates that obtained for the prior art device. As the film thickness of the first cap layer $t_n$ increases, $\rho_c$ decreases and levels off to a constant value when $t_n$ is 10 nm or more. While the minimum value of $\rho_c$ is $1.4 \times 10^{-6}$ $\Omega cm^2$ in the prior art, it is $5.5 \times 10^{-7}$ $\Omega cm^2$ in the present invention, which shows a decrease of about 60%. Meanwhile, in either structure, the sheet carrier concentration in the undoped InGaAs 2DEG channel layer is maintained at a substantially constant value ($\sim 3.6 \times 10^{12}$/cm$^2$) so that the sheet resistance ($r_s$) is substantially the same in both structures. Thus, this embodiment of the present invention can further reduce $\rho_c$ of the non-alloy ohmic contact without increasing $r_s$, and can reduce the parasitic resistance of the heterojunction FET device. In addition, as the gate electrode is formed on the undoped InAlAs layer 46, high gate withstand voltage can be assured.

(Third Embodiment)

Figure 7:
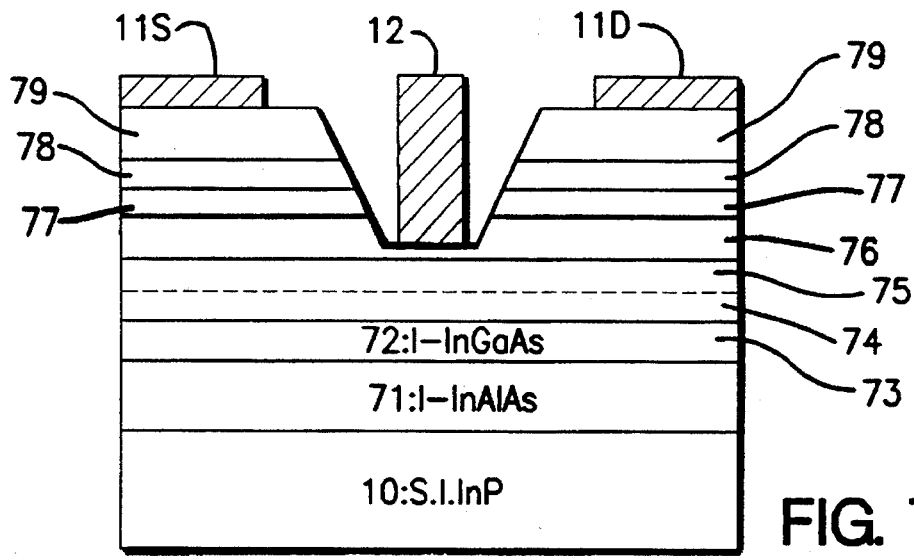
FIG. 7 is a cross section showing the structure of the heterojunction FET according to the third embodiment of the present invention.

FIG. 7 is a cross section showing the structure of the hetero-junction FET according to the third embodiment of the present invention. In the figure, there are shown an SI-InP substrate 10, an undoped InAlAs layer 71 constituting a buffer layer, an undoped InGaAs layer 72 constituting a 2DEG channel layer, an undoped InAlAs layer 73 constituting a spacer layer, an Si planar doped layer 74, an n-type InAlAs layer 75 constituting an electron supply layer, an undoped InAlAs layer 76 constituting a Schottky layer, and cap layers 77, 78, and 79 each of which consists of an n-type InAlAs layer (first cap layer), an n-type In(AlGa)As compositionally graded layer (second cap layer), and an n-type InGaAs layer (third cap layer). There are also a source electrode 11S, a drain electrode 11D, and a gate electrode 12. One of the novel features of this embodiment lies in that an n-type In(AlGa)As compositionally graded layer 78 is inserted at the interface between the n-type InAlAs cap layer 77 and the n-type InGaAs cap layer 79.

Such heterojunction FET is produced as follows. Sequentially formed on (100) Si-InP substrate 10 by, for example, MBE are:

Undoped InAlAs layer 71 . . . 200 nm,
Undoped InGaAs layer 72 . . . 40 nm,
Undoped InAlAs layer 73 . . . 3 nm,
Si planar doped layer 74
(sheet concentration $5 \times 10^{12}$/cm$^2$)
n-type InAlAs layer 75
(impurity concentration $2 \times 10^{18}$/cm$^3$) . . . 15 nm,
Undoped InAlAs layer 76 . . . 20 nm,
n-type InAlAs layer 77
(impurity concentration $5 \times 10^{18}$/cm$^3$) . . . 20 nm,
n-type In(Al$_y$Ga$_{1-y}$)As layer 78 (y changing from 1 to 0)
(impurity concentration $5 \times 10^{18}$/cm$^3$) ... 5 nm, and n-type InGaAs layer 79

(impurity concentration $5\times10^{18}/cm^3$) ... 20 nm.

Then, the source and drain electrodes 11S, 11D as well as the gate electrode 12 are formed in much the same way as in the case of the first embodiment. The heterojunction FET as shown in FIG. 7 is thus fabricated.

Figure 8:
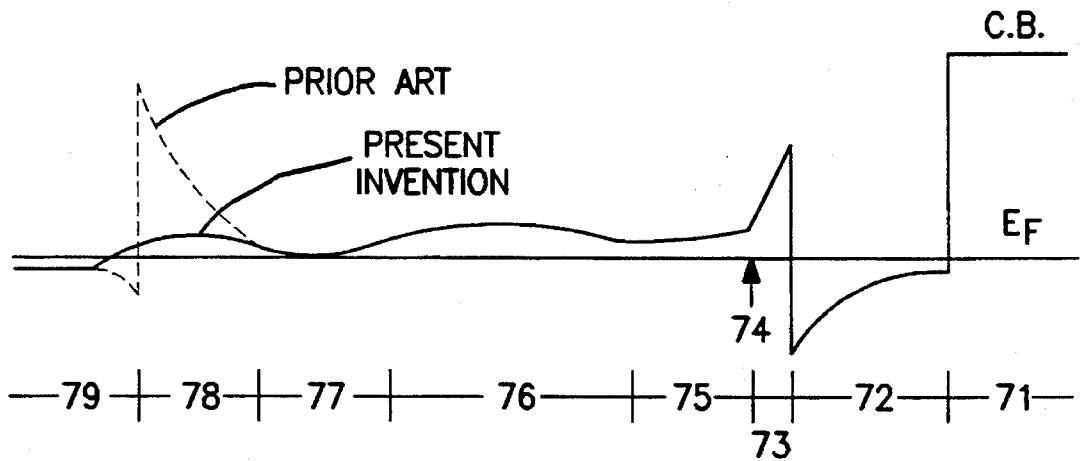
FIG. 8 is a potential band diagram showing the conduction band minimum of the heterojunction FET according to the third embodiment of the present invention.
Figure 9:
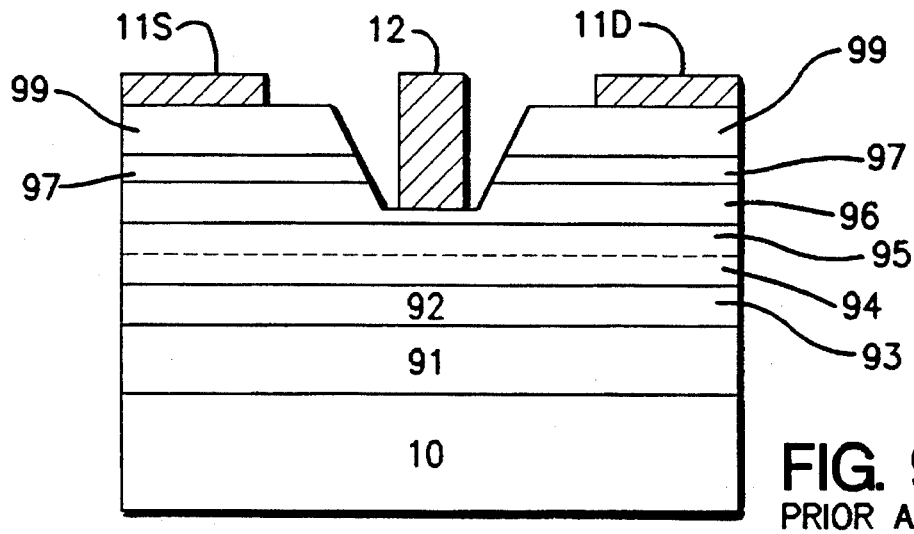
FIG. 9 is a cross section showing the structure of the heterojunction FET according to the prior art.

FIG. 8 shows a conduction band minimum profile between the n-type InGaAs cap layer 79 and the undoped InAlAs buffer layer 71 of the present embodiment (solid line) and the prior art. As described earlier, because the composition ratio y of Al in the $In(Al_yGa_{1-y})As$ layer 78 (second cap layer) is gradually decreased from 1 to 0 from the first cap layer side to the third cap layer side, there exists no conduction band spike, thereby lowering the potential barrier so that tunnel current is caused to flow therethrough very easily. Similar to the second embodiment, the sheet carrier concentration is substantially equal to that in the conventional prior art structure, and the sheet resistance ($r_s$) is also substantially equal. Thus, the embodiment can further reduce the contact resistivity ($\rho_c$) of the non-alloy ohmic contact without increasing $r_s$, and can reduce the parasitic resistance of the heterojunction FET device. In addition, as the gate-electrode is formed on the undoped InAlAs layer 76, high gate withstand voltage can be assured.

Although, in the third embodiment, the composition y in the n-type $In(Al_yGa_{1-y})As$ layer 78 is continuously varied, a similar effect can be attained by composing this layer in a plurality of $In(Al_yGa_{1-y})As$ layers, and varying the composition y in a stepwise fashion.

Although the above embodiments employ a Si planar doped layer as the source of electrons in the n-InAlAs electron supply layer, it may be replaced with an n-type InAlAs layer with high impurity concentration.

Further, although the above embodiments employ an n-type InAlAs layer with uniform impurity concentration as the first cap layer, it may be replaced with an InAlAs layer containing at least one planar doped Si layer.

In addition, although it is sufficient to choose the alloy composition of the InGaAs layers to be $In_{0.53}Ga_{0.47}As$ whose lattice matches the InP substrate, it may be possible to employ, for example, an $In_{0.53+x}Ga_{0.47-x}As$ ($-0.53<x<0.47$) strained layer as the InGaAs channel layer and the third cap layer. Similarly, although the alloy composition of the InAlAs layers may be advantageously chosen to be $In_{0.52}Al_{0.48}As$ which lattice matches to the InP substrate, it may also be possible to use strained $In_{0.52+z}Al_{0.48-z}As$ ($-0.52<z<0.48$).

As is clearly seen from the above detailed description, since in the present invention the cap layer of the InAlAs/InGaAs type heterojunction FET has a triple-layer structure comprising first and second cap layers consisting of n-type InAlAs layers, and a third cap layer consisting of an n-type InGaAs layer, it is possible to lower the potential barrier at the interface of the cap layer so that the contact resistivity can be reduced without reducing the sheet carrier concentration. Thus, the parasitic resistance of the FET can be reduced, and gain and noise performance can be further improved.

Although the present invention has been fully described by way of the preferred embodiments thereof with reference to the accompanying drawings, various changes and modifications will be apparent to those skilled in this field. Therefore, unless these changes and modifications otherwise depart from the scope of the present invention, they would be construed as included therein.

I claim:

1. A heterojunction field effect transistor comprising:

a multi-layered hetero-structure in which an undoped InAlAs buffer layer, an undoped InGaAs two-dimensional electron gas channel layer, an InAlAs electron supply layer containing at least one n-type layer, an undoped InAlAs Schottky layer, and a cap layer are sequentially formed on a semi-insulating InP substrate;

a source electrode and a drain electrode in contact with said cap layer; and a gate electrode formed between said source and drain electrodes and in contact with said undoped InAlAs Schottky layer;

said cap layer having a laminated structure comprising a first cap layer of InAlAs comprising at least one n-type layer, a second cap layer comprising undoped InGaAs, and a third cap layer comprising n-type InGaAs.

2. A heterojunction field effect transistor according to claim 1, wherein said second cap layer has a film thickness ranging from at least 3 nm to no more than 10 nm.

3. A heterojunction field effect transistor comprising:

a multi-layered hetero-structure in which an undoped InAlAs buffer layer, an undoped InGaAs two-dimensional electron gas channel layer, an InAlAs electron supply layer containing at least one n-type layer, an undoped InAlAs Schottky layer, and a cap layer are sequentially formed on a semi-insulating InP substrate;

a source electrode and a drain electrode in contact with said cap layer; and a gate electrode formed between said source and drain electrodes and in contact with said undoped InAlAs Schottky layer;

said cap layer having a laminated structure comprising a first cap layer of InAlAs comprising at least one n-type layer, a second cap layer consisting of n-type $In(Al_yGa_{1-y})As$ ($0<y<1$), and a third cap layer consisting of n-type InGaAs.

4. A heterojunction field effect transistor comprising:

a multi-layered hetero-structure in which an undoped InAlAs buffer layer, an undoped InGaAs two-dimensional electron gas channel layer, an InAlAs electron supply layer containing at least one n-type layer, an undoped InAlAs Schottky layer, and a cap layer are sequentially formed on a semi-insulating InP substrate;

a source electrode and a drain electrode in contact with said cap layer; and p1 a gate electrode between said source and drain electrodes and in contact with said undoped InAlAs Schottky layer;

said cap layer having a laminated structure comprising a first cap layer of InAlAs comprising at least one n-type layer, a second cap layer comprising a n-type compositionally graded layer of In $(Al_yGa_{1-y})As$, and a third cap layer comprising n-type InGaAs.

5. A heterojunction field effect transistor according to claim 4, wherein a composition ratio y of Al in said second cap layer changes from 1 to 0 in a direction from said first cap layer to said third cap layer.

6. The heterojunction field effect transistor as claimed in claim 5, wherein said change in composition ratio y of Al is a continuous decrease from 1 to 0.

7. The heterojunction field effect transistor as claimed in claim 5, wherein said second cap layer comprises a plurality of n-type $In(Al_yGa_{1-y})As$ layers so that said change in composition ratio y of Al is a stepwise decrease from 1 to 0.

* * * * *